US009111725B2

(12) United States Patent
Boston

(10) Patent No.: US 9,111,725 B2
(45) **Date of Patent: *Aug. 18, 2015**

(54) RF/VHF IMPEDANCE MATCHING, 4 QUADRANT, DUAL DIRECTIONAL COUPLER WITH $V_{RMS}/I_{RMS}$ RESPONDING DETECTOR CIRCUITRY

(71) Applicant: Gerald E. Boston, Green Valley, AZ (US)

(72) Inventor: Gerald E. Boston, Green Valley, AZ (US)

(73) Assignee: COMET TECHNOLOGIES USA, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/456,019

(22) Filed: Aug. 11, 2014

(65) Prior Publication Data

US 2015/0002020 A1 Jan. 1, 2015

Related U.S. Application Data

(63) Continuation of application No. 12/908,755, filed on Oct. 20, 2010, now Pat. No. 8,803,424.

(51) Int. Cl.

*H01J 37/32* (2006.01)
*H03H 7/40* (2006.01)

(52) U.S. Cl.

CPC ............ *H01J 37/32183* (2013.01); *H03H 7/40* (2013.01)

(58) Field of Classification Search

USPC .................. 315/111.11–111.19; 156/345.28, 156/345.44–345.49; 204/192.1–192.18

See application file for complete search history.

(56) References Cited

U.S. PATENT DOCUMENTS 8,803,424 B2 * 8/2014 Boston .................... 315/111.21

* cited by examiner

*Primary Examiner* — Douglas W Owens
*Assistant Examiner* — Jonathan Cooper
(74) *Attorney, Agent, or Firm* — Edmonds & Nolte, PC

(57) ABSTRACT

A physical vapor deposition system may include an RF generator configured to transmit an AC process signal to a physical vapor deposition chamber via an RF matching network. A detector circuit may be configured to sense the AC process signal and output a DC magnitude error signal and a DC phase error signal. A controller may be coupled to the detector circuit and the RF matching network and configured to receive the DC magnitude and phase error signals and to vary an impedance of the RF matching network in response to the DC magnitude and phase error signals.

20 Claims, 3 Drawing Sheets

RF/VHF IMPEDANCE MATCHING, 4 QUADRANT, DUAL DIRECTIONAL COUPLER WITH $V_{RMS}/I_{RMS}$ RESPONDING DETECTOR CIRCUITRY

CROSS-REFERENCE TO RELATED APPLICATIONS

This non-provisional application claims the benefit under 35 U.S.C. §120 of U.S. application Ser. No. 12/908,755, filed Oct. 20, 2010, entitled "RF/VHF IMPEDANCE MATCHING, 4 QUADRANT, DUAL DIRECTIONAL COUPLER WITH $V_{RMS}/I_{RMS}$ RESPONDING DETECTOR CIRCUITRY," and issued on Aug. 12, 2014, as U.S. Pat. No. 8,803,424. The content of this application is hereby incorporated by reference in its entirety to the extent consistent with the present disclosure.

BACKGROUND

Physical vapor deposition ("PVD") systems are used to deposit thin layers of a target material onto a substrate. PVD systems generally include a radio frequency ("RF") generator that transmits a signal to a deposition chamber. An RF match having a variable impedance is generally located between the RF generator and the chamber. The RF match may be tuned, i.e., the impedance may be varied, to make the impedance of the RF match be the complex conjugate of the deposition chamber's impedance. Tuning the RF match reduces reflected power from the chamber, thereby increasing the power transferred from the RF generator to the chamber and into the plasma deposition process.

Conventional RF matches, however, are slow-acting, resulting in a power loss. Moreover, conventional RF matches often begin tuning in the wrong direction and have difficulty identifying and correcting this error. There is a need, therefore, for an improved RF match that overcomes the deficiencies of conventional systems.

SUMMARY

Embodiments of the disclosure may provide a physical vapor deposition system. The system may include an RF generator configured to transmit an AC process signal to a physical vapor deposition chamber via an RF matching network. A rod may be coupled to the RF generator and configured to sense the AC process signal generated by the RF generator. A first converter may be coupled to the rod and configured to receive a first AC voltage signal from the rod and to output a DC voltage magnitude signal. A second converter may be coupled to the rod and configured to receive a first AC current signal from the rod and to output a DC current magnitude signal. A multiplier may be coupled to the first and second converters and configured to receive the DC voltage and current magnitude signals and to output a DC magnitude error signal. A phase detector may be coupled to the rod and configured to receive a second AC voltage signal and a second AC current signal from the rod and to output a DC phase difference signal, and the DC phase difference signal may be converted into a DC phase error signal. A controller may be coupled to the multiplier, the phase detector, and the RF matching network and configured to receive the DC magnitude and phase error signals and to vary an impedance of the RF matching network in response to the DC magnitude and phase error signals.

Embodiments of the disclosure may also provide a method for varying an impedance of an RF matching network in a physical vapor deposition system. The method may include transmitting an AC process signal from an RF generator to a physical vapor deposition chamber via the RF matching network. The method may also include sensing the AC process signal generated by the RF generator with a rod coupled to the RF generator. The method may further include converting a first AC voltage signal from the rod to a DC voltage magnitude signal with a first converter. The method may further include converting a first AC current signal from the rod to a DC current magnitude signal with a second converter. The method may further include converting the DC voltage and current magnitude signals to a DC magnitude error signal with a multiplier coupled to the first and second converters. The method may further include converting second AC voltage and current signals from the rod to a DC phase difference signal with a phase detector, wherein the DC phase difference signal is converted into a DC phase error signal. The method may further include varying the impedance of the RF matching network with a controller in response to the DC magnitude and phase error signals.

Embodiments of the disclosure may further provide a detector circuit for a physical vapor deposition system. The detector circuit may include a rod configured to sense an AC process signal transmitted from an RF generator to a physical vapor deposition chamber. A first converter may be coupled to the rod and configured to receive a first AC voltage signal from the rod and to output a DC voltage magnitude signal. A second converter may be coupled to the rod and configured to receive a first AC current signal from the rod and to output a DC current magnitude signal. A multiplier may be coupled to an output of the first and second converters and configured to receive the DC voltage and current magnitude signals and to output a DC magnitude error signal. A phase detector may be coupled to the rod and configured to receive a second AC voltage signal and a second AC current signal from the rod and to output a DC phase difference signal, and the DC phase difference signal may be converted into a DC phase error signal. At least one of the first converter, the second converter, the multiplier, and the phase detector may include a telecommunications integrated circuit.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
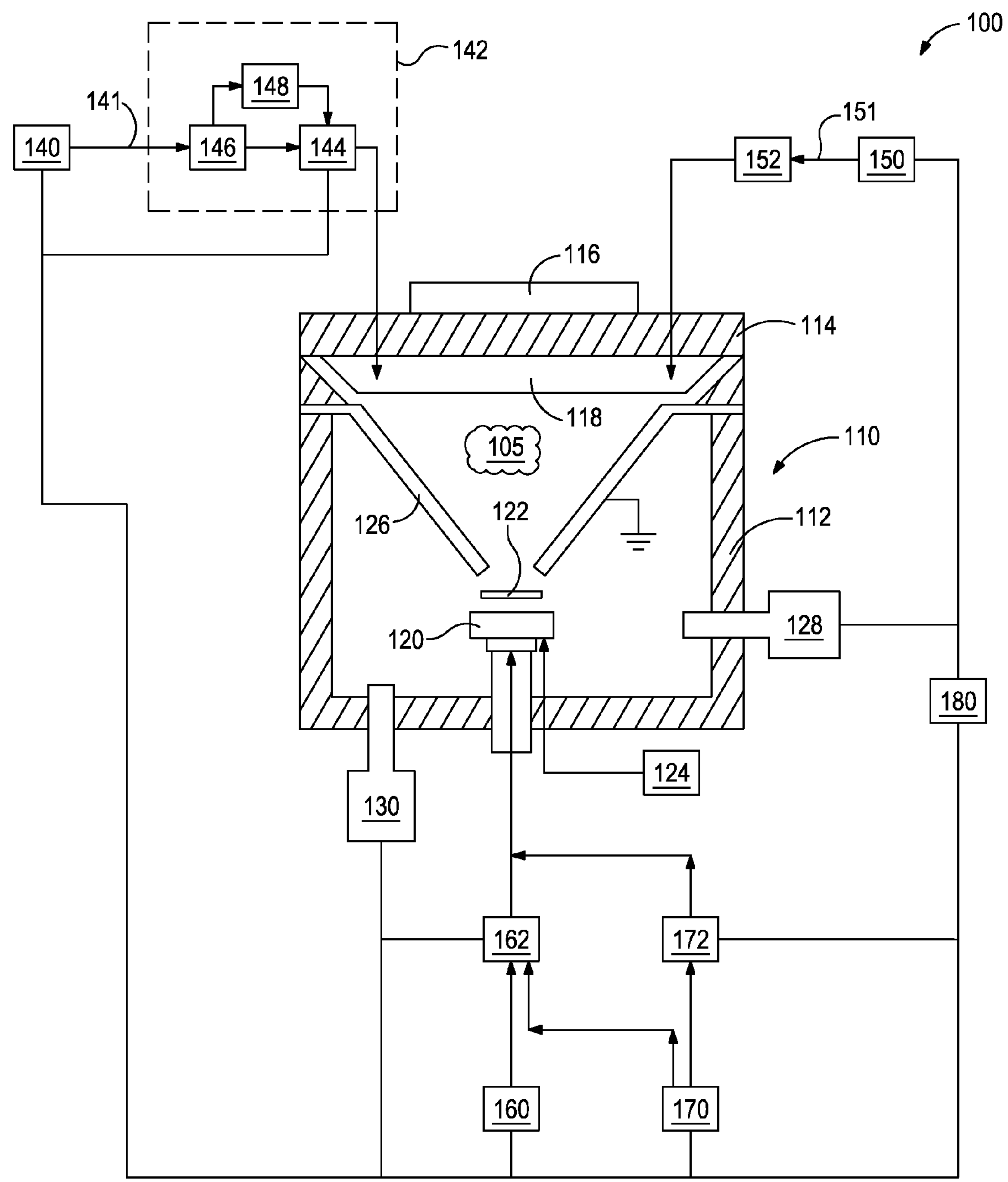
FIG. 1 illustrates an exemplary physical vapor deposition system, according to one or more embodiments described.

It is to be understood that the following disclosure describes several exemplary embodiments for implementing different features, structures, or functions of the invention. Exemplary embodiments of components, arrangements, and configurations are described below to simplify the present disclosure, however, these exemplary embodiments are provided merely as examples and are not intended to limit the scope of the invention. Additionally, the present disclosure may repeat reference numerals and/or letters in the various exemplary embodiments and across the Figures provided herein. This repetition is for the purpose of simplicity and clarity and does not in itself dictate a relationship between the various exemplary embodiments and/or configurations discussed in the various Figures. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Finally, the exemplary embodiments presented below may be combined in any combination of ways, i.e., any element from one exemplary embodiment may be used in any other exemplary embodiment, without departing from the scope of the disclosure.

Additionally, certain terms are used throughout the following description and claims to refer to particular components. As one skilled in the art will appreciate, various entities may refer to the same component by different names, and as such, the naming convention for the elements described herein is not intended to limit the scope of the invention, unless otherwise specifically defined herein. Further, the naming convention used herein is not intended to distinguish between components that differ in name but not function. Further, in the following discussion and in the claims, the terms "including" and "comprising" are used in an open-ended fashion, and thus should be interpreted to mean "including, but not limited to." All numerical values in this disclosure may be exact or approximate values unless otherwise specifically stated. Accordingly, various embodiments of the disclosure may deviate from the numbers, values, and ranges disclosed herein without departing from the intended scope. Furthermore, as it is used in the claims or specification, the term "or" is intended to encompass both exclusive and inclusive cases, i.e., "A or B" is intended to be synonymous with "at least one of A and B," unless otherwise expressly specified herein.

FIG. 1 illustrates an exemplary physical vapor deposition ("PVD") system 100 of this disclosure. The PVD system 100 may include a chamber 110 having a body 112 and a lid or ceiling 114. A magnet assembly 116 may be disposed on an outer side of the lid 114. In at least one embodiment, the magnet assembly 116 may be a permanent magnet disposed on a plate that is rotated by a motor between about 0.1 and about 10 revolutions per second. For example, the magnet assembly 116 may rotate in a counterclockwise direction at about 1 revolution per second.

A target 118 is generally positioned on an inner side of the lid 114 generally opposite the magnet assembly 116. In at least one embodiment, the target 118 may be at least partially composed of, but is not limited to, elements such as, borides, carbides, fluorides, oxides, silicides, selenides, sulfides, tellerudes, precious metals, alloys, intermetallics, or the like. For example, the target 118 may be composed of copper (Cu), silicon (Si), gold (Au), titanium (Ti), tantalum (Ta), tungsten (N), aluminum (Al), a combination thereof, or the like.

A pedestal 120 may be disposed in the chamber 110 and configured to support a substrate 122. In at least one embodiment, the pedestal 120 includes a chuck configured to hold the substrate 122 to the pedestal 120. Suitable chucks may include mechanical chucks, vacuum chucks, electrostatic chucks ("e-chucks"), or the like. Mechanical chucks include one or more clamps to hold the substrate 122 to the pedestal 120. Vacuum chucks include a vacuum aperture coupled to a vacuum source to hold the substrate 122 to the pedestal 120. E-chucks rely on the electrostatic pressure generated by an electrode to hold the substrate 122 to the pedestal 120. In at least one embodiment, the pedestal 122 may be or include an e-chuck powered by a DC power supply 124.

A shield 126 may at least partially surround the pedestal 120 and the substrate 122 and be electrically grounded, for example, by physical attachment to the chamber body 112. The shield 126 is generally configured to receive deposition particles that would normally deposit on the interior walls of the chamber 110 during the PVD process.

A gas supply 128 may be coupled to the chamber 110 and configured to introduce a controlled flow of a process gas into the chamber 110. In at least one embodiment, the process gas introduced to the chamber 110 may include Argon (Ar), Nitrogen ($N_2$), Hydrogen ($H_2$), Helium (He), Xenon (Xe), a combination thereof, or the like.

A vacuum pump 130 may be coupled to the chamber 110 and configured maintain a desired sub-atmospheric pressure or vacuum level in the chamber 110. In at least one embodiment, the vacuum pump 130 may maintain a pressure of between about 1 and about 100 millitorrs in the chamber 110 during a deposition process.

A first radio frequency ("RF") generator 140 may be configured to supply an AC process signal 141 at a frequency F1 to the chamber 110. In at least one embodiment, F1 may be between about 30 Hz and about 300 MHz. For example, F1 may be between about 30 MHz and about 162 MHz. A first RF match system 142 may be coupled to the RF generator 140 and configured to decrease reflected power from the load, i.e., the chamber 110, thereby increasing the power transferred from the RF generator 140 to the chamber 110. The RF match system 142 may be or include an RF matching network 144 having a variable impedance. The power transfer from the first RF generator 140 to the chamber 110 via the RF matching network 144 is maximized when the impedance of the RF matching network 144 is adjusted to equal or approximate the complex conjugate of the impedance of the chamber 110. In at least one exemplary embodiment, when the impedance of the RF matching network 144 reaches the complex conjugate of the impedance of the chamber 110, the RF generator 140 will see an impedance of about 50 ohms at the input of the RF matching network 144.

In at least one embodiment, a detector circuit 146 may be coupled to or disposed within the RF match system 142. The detector circuit 146 may be configured to detect or sense the process signal 141 from the RF generator 140 and to generate a magnitude error signal and a phase error signal.

A match controller 148 may be coupled to the RF matching network 144 and the detector circuit 146. In at least one embodiment, the match controller 148 may be coupled to or be part of the RF match system 142. In another embodiment, the match controller 148 may be coupled to or be part of an overall system controller 180. The match controller 148 may be configured to adjust the impedance of the RF matching network 144 in response to the magnitude and phase error signals from the detector circuit 146 to decrease reflected power from the chamber 110.

A DC generator 150 may supply a DC signal 151 to the chamber 110. A DC filter 152 may be coupled to the DC generator 150 and configured to block or prevent the process signal 141 and corresponding harmonics from the RF generator 140 from reaching and damaging the DC generator 150.

A second RF generator 160 may be configured to supply an AC signal at a frequency F2 to the pedestal 120. In at least one embodiment, the signal from the second RF generator 160 may be used to bias the chamber 110 and/or the pedestal 120. A second RF match system 162 may be coupled to and receive the signal from the second RF generator 160. The second RF match system 162 may be the same as the first RF match 142 system, e.g., a double input match, or it may be different, as desired.

In at least one embodiment, a third RF generator 170 may be configured to supply a signal at a frequency F3 to the pedestal 120. In at least one embodiment, the second RF generator 160 and the third RF generator 170 may be coupled to a single RF match system 162. In another embodiment, the third RF generator 170 may be coupled to a third RF match system 172. The third RF match system 172 may be the same as the first and/or second RF match systems 142, 162, or it may be different, as desired. Although not shown, one or more additional RF generators and corresponding RF matches may be implemented in the PVD system 100.

A system controller 180 may be coupled to one or more of the gas supply 128, the vacuum pump 130, the RF generators 140, 160, 170, and the DC generator 150. In at least one embodiment, the system controller 180 may also be coupled to one or more of the RF match systems 142, 162, 172. The system controller 180 may be configured to the control the various functions of each component to which it is coupled. For example, the system controller 180 may be configured to control the rate of gas introduced to the chamber 110 via the gas supply 128. The system controller 180 may be configured to adjust the pressure within the chamber 110 with the vacuum pump 130. The system controller 180 may be configured to adjust the output signals from the RF generators 140, 160, 170, and/or the DC generator 150. In at least one embodiment, the system controller 180 may be configured to adjust the impedances of the RF match systems 142, 162, 172.

Figure 2:
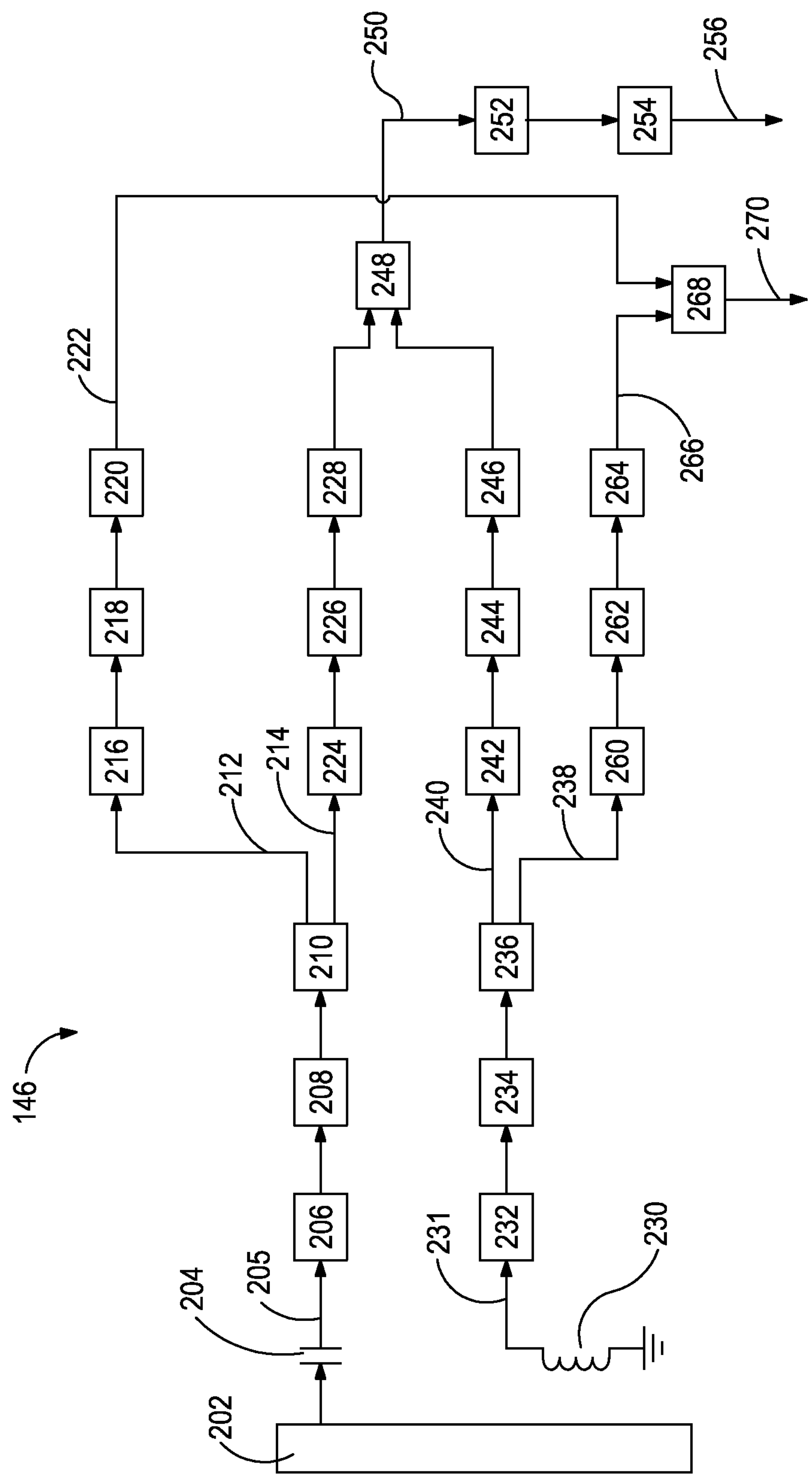
FIG. 2 illustrates an exemplary detector circuit from FIG. 1, according to one or more embodiments described.

FIG. 2 illustrates an exemplary detector circuit 146 from FIG. 1, according to one or more embodiments described. The detector circuit 146 may include a rod 202 or other device coupled to the RF generator 140 (see FIG. 1) and configured to detect or sense the process signal 141 from the RF generator 140. A capacitor 204 may be coupled to the rod 202 and configured to pick up an initial AC voltage ($V_{RMS}$) signal 205 from the RF generator 140 via the rod 202. A voltage scaler 206 may be coupled to the capacitor 204 and configured to scale the $V_{RMS}$ signal 205 received from the capacitor 204, such as with one or more resistors. A low pass filter 208 may be coupled to the voltage scaler 206 and configured to pass frequencies of the scaled $V_{RMS}$ signal 205 below a cutoff frequency and to attenuate frequencies above the cutoff frequency.

A power splitter 210 may be coupled to the low pass filter 208 and configured to split the $V_{RMS}$ signal 205 from the low pass filter 208 and output a first $V_{RMS}$ signal 212 and a second $V_{RMS}$ signal 214. In at least one embodiment, the power splitter 210 may be or include a telecommunications integrated circuit (telecom IC) having wide bandwidth capabilities. For example, the telecom IC may be operable at variable frequencies between about 400 kHz and 3 GHz. In at least one embodiment, rather than creating the second $V_{RMS}$ signal 214 with the power splitter 210, a second capacitor, voltage scaler, and low pass filter (not shown) may be placed in parallel with the capacitor 204, scaler 206, and low pass filter 208 to create the second $V_{RMS}$ signal 214.

A voltage scaler 216 may be coupled to the power splitter 210 and configured to receive and scale the first $V_{RMS}$ signal 212 from the power splitter 210. The voltage scaler 216 may be the same as the voltage scaler 206, or it may be a different component, as desired. A clamp 218 may be coupled to the voltage scaler 216 and configured to clamp any overshoot and/or undershoot of the first $V_{RMS}$ signal 212 from the voltage scaler 216. A converter 220 may be coupled to the clamp 218 and configured to convert the first $V_{RMS}$ signal 212 from the clamp 218 to a voltage magnitude signal 222 in DC form. In at least one embodiment, the converter 220 may be a high frequency, low voltage, linear responding RMS to DC power converter. In at least one embodiment, the converter 220 may be or include a telecom IC having wide bandwidth capabilities. The telecom IC in the converter 220 may be the same as the telecom IC in the power splitter 210, or it may be a different component, as desired.

An attenuator 224 may be coupled to the power splitter 210 and configured to reduce the amplitude and/or power of the second $V_{RMS}$ signal 214 from the power splitter 210 without appreciably distorting its waveform. A clamp 226 may be coupled to the attenuator 224 and configured to clamp any overshoot and/or undershoot of the second $V_{RMS}$ signal 214 from the attenuator 224. A band pass filter 228 may be coupled to the clamp 226 and configured to pass frequencies of the $V_{RMS}$ signal 214 from the clamp 226 within a set range and attenuate frequencies outside the set range.

An inductor 230 may be coupled to the rod 202 and configured to pick up an initial AC current ($I_{RMS}$) signal 231 from the RF generator 140 via the rod 202. A current scaler 232 may be coupled to the inductor 230 and configured to scale the $I_{RMS}$ signal 231 received from the inductor 230. A low pass filter 234 may be coupled to the current scaler 232 and configured to pass frequencies of the scaled $I_{RMS}$ signal 231 from the current scaler 232 below a cutoff frequency and to attenuate frequencies above the cutoff frequency. A power splitter 236 may be coupled to the low pass filter 234 and configured to split the $I_{RMS}$ signal 231 from the low pass filter 234 and output a first $I_{RMS}$ signal 238 and a second $I_{RMS}$ signal 240. In at least one embodiment, the scaler 232, low pass filter 234, and/or power splitter 236 may be the same as the scaler 206, low pass filter 208, and/or power splitter 210, or they may be different, as desired. In at least one embodiment, rather than creating the second $I_{RMS}$ signal 240 with the power splitter 236, a second inductor, current scaler, and low pass filter (not shown) may be placed in parallel with the inductor 230, current scaler 232, and low pass filter 234 to create the second $I_{RMS}$ signal 240.

An attenuator 242 may be coupled to the power splitter 236 and configured to receive the second $I_{RMS}$ signal 240 from the power splitter 236 and to reduce the amplitude and/or power of the second $I_{RMS}$ signal 240 without appreciably distorting its waveform. A clamp 244 may be coupled to the attenuator 242 and configured to clamp any overshoot and/or undershoot of the second $I_{RMS}$ signal 240 from the attenuator 242. A band pass filter 246 may be coupled to the clamp 244 and configured to pass frequencies of the second $I_{RMS}$ signal 240 from the clamp 244 within a set range and attenuate frequencies outside the set range. In at least one embodiment, the attenuator 242, clamp 244, and/or band pass filter 246 may be the same as the attenuator 224, clamp 226, and/or band pass filter 228, or they may be different components, as desired.

A phase detector 248 may be coupled to the band pass filters 228, 246 and configured to receive the second $V_{RMS}$ signal 214 from the band pass filter 228 and the second $I_{RMS}$ signal 240 from the band pass filter 246 and to output phase difference signal 250 in DC form that corresponds to the phase difference in degrees or radians between the $V_{RMS}$ signal 214 and the $I_{RMS}$ signal 240. In at least one embodiment, the phase detector 248 may be an RF/IF gain/phase detector. In at least one embodiment, the phase detector 248 may be or include a telecom IC having wide bandwidth capabilities. The telecom IC in the phase detector 248 may be the same as the telecom IC in the power splitter 210, the power splitter 236, and/or the converter 220, or it may be different, as desired.

A buffer 252 may be coupled to the phase detector 248, and a scaler 254 may be coupled to the buffer 252 and configured to scale the phase difference signal 250. The scaler 254 may be the same as one or more of the scalers 206, 216, 232, or it may be different, as desired. The scaler 254 may be configured to output a phase error signal 256 in DC form that corresponds to the phase error between the $V_{RMS}$ signal 214 and the $I_{RMS}$ signal 240.

A scaler 260 may be coupled to the power splitter 236 and configured to receive and scale the first $I_{RMS}$ signal 238 from the power splitter 236. A clamp 262 may be coupled to the scaler 260 and configured to clamp any overshoot and/or undershoot of the $I_{RMS}$ signal 238 from the scaler 260. A converter 264 may be coupled to the clamp 262 and configured to convert the $I_{RMS}$ signal 238 from the clamp 262 to a current magnitude signal 266 in DC form. In at least one embodiment, the converter 264 may be high frequency, low voltage, linear responding $_{RMS}$ to DC power converter. In at least one embodiment, the converter 264 may be or include a telecom IC having wide bandwidth capabilities. The telecom IC in the converter 264 may be the same as the telecom IC in the power splitter 210, the converter 220, the power splitter 236, and/or the phase detector 248, or it may be a different component, as desired. In at least one embodiment, the scaler 260, clamp 262, and/or converter 264 may be the same as the scaler 216, clamp 218, and/or converter 220, or they may be different components, as desired.

A multiplier 268 may be coupled to the converters 220 and 264 and configured to receive the voltage magnitude signal 222 from the converter 220 and the current magnitude signal 266 from the converter 264 and to output a magnitude error signal 270 in DC form. In at least one embodiment, the multiplier 268 may be a 4 quadrant multiplier. In at least one embodiment, the multiplier 268 may be or include a telecom IC having wide bandwidth capabilities. The telecom IC in the multiplier 268 may be the same as the telecom IC in the power splitter 210, the converter 220, the power splitter 236, the phase detector 248, and/or the converter 264, or it may be a different component, as desired.

In operation, with continuing reference to FIGS. 1 and 2, the RF generator 140 is in pulse mode and supplies the pulsing process signal 141 to the target 118 in the chamber 110. The DC generator 150 also supplies the DC signal 151 to the target 118 in the chamber 110. The second RF generator 160 and/or the third RF generator 170 supply signal(s) to the pedestal 120 in the chamber 110 providing a bias. Gas is introduced to the chamber 110 from the gas supply 128 to facilitate the formation of plasma 105 within the chamber 110. Ionized atoms within the plasma 105, which are positively charged, are attracted to and accelerated toward the target 118, which is negatively charged. Upon impact with the target 118, the ionized atoms dislodge atoms from the target 118. The dislodged atoms become ionized in the plasma 105 and are then accelerated toward the substrate 122 by the magnetic field within the chamber 110.

The rod 202 senses the signal 141 from the RF generator 140, and the capacitor 204 picks up the $V_{RMS}$ signal 205 from the rod 202. The $V_{RMS}$ signal 205 may be scaled and filtered to prevent harmonic distortion from the converter 220. The $V_{RMS}$ signal 205 may then be power split into a first $V_{RMS}$ signal 212 and a second $V_{RMS}$ signal 214. The $V_{RMS}$ signal 212 may be scaled, clamped, and driven to the converter 220. The $V_{RMS}$ signal 212 may then be converted to a voltage magnitude signal 222 in DC form by the converter 220. The $V_{RMS}$ signal 214 may be attenuated, clamped, filtered, and driven to the phase detector 248.

The inductor 230 picks up the $I_{RMS}$ signal 231 from the rod 202. The $I_{RMS}$ signal 231 may be scaled and filtered to prevent harmonic distortion from the converter 264. The $I_{RMS}$ signal 231 may then be power split into a first $I_{RMS}$ signal 238 and a second $I_{RMS}$ signal 240. The $I_{RMS}$ signal 240 may be attenuated, clamped, filtered, and driven to the phase detector 248.

The phase detector 248 may receive the $V_{RMS}$ signal 214 and the $I_{RMS}$ signal 240 and output a signal 250 in DC form that corresponds to the phase difference between the $V_{RMS}$ signal 214 and the $I_{RMS}$ signal 240. The phase difference signal 250 may be buffered and scaled to produce a phase error signal 256 in DC form that corresponds to the phase error between the $V_{RMS}$ signal 214 and the $I_{RMS}$ signal 240.

The $I_{RMS}$ signal 238 may be scaled, clamped, and driven to the converter 264. The $I_{RMS}$ signal 238 may then be converted to a current magnitude signal 266 in DC form by the converter 264. The voltage magnitude signal 222 and the current magnitude signal 266 may then be converted to a magnitude error signal 270 by the multiplier 268.

The match controller 148 (see FIG. 1) may receive the phase error signal 256 and the magnitude error signal 270 from the detector circuit 146, and based on the signals 256, 270, the match controller 148 may adjust the impedance of the RF matching network 144 to reduce and/or eliminate reflected power from the physical vapor deposition chamber 110. In at least one embodiment, the match controller 148 may also receive the voltage magnitude signal 222 and the current magnitude signal 266. In at least one embodiment, the match controller 148 may adjust the impedance of the RF matching network 144 by adjusting variable components within the RF matching network 144. In at least one embodiment, the variable components may be adjusted with stepper motors or the like that are controlled by one or more controllers, such as the match controller 148 or the system controller 180. In at least one embodiment, the variable components may be or include variable capacitors. As a result, the RF matching network 144 may be auto-tuned to increase power transfer efficiency from the RF generator 140 to the chamber 110.

Figure 3:
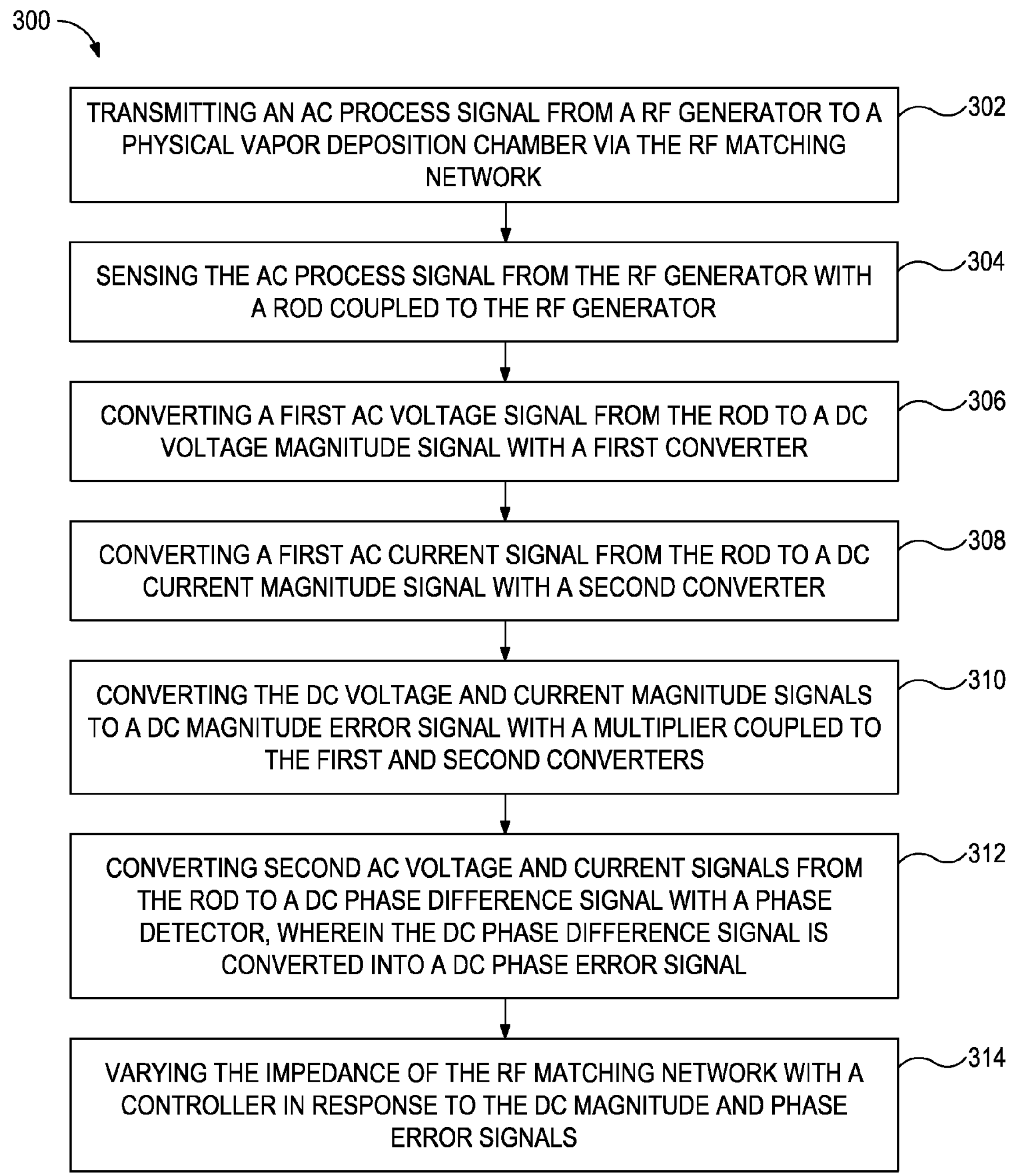
FIG. 3 illustrates an exemplary method for varying an impedance of an RF matching network, according to one or more embodiments described.

FIG. 3 illustrates an exemplary method 300 for varying an impedance of an RF matching network in a physical vapor deposition system, according to one or more embodiments described. The method 300 may include transmitting an AC process signal from an RF generator to a physical vapor deposition chamber via an RF matching network, as shown at 302. The method 300 may also include sensing the AC process signal generated by the RF generator with a rod coupled to the RF generator, as shown at 304. The method 300 may further include converting a first AC voltage signal from the rod to a DC voltage magnitude signal with a first converter, as shown at 306. The method 300 may further include converting a first AC current signal from the rod to a DC current magnitude signal with a second converter, as shown at 308. The method 300 may further include converting the DC voltage and current magnitude signals to a DC magnitude error signal with a multiplier coupled to the first and second converters, as shown at 310. The method 300 may further include converting second AC voltage and current signals from the rod to a DC phase difference signal with a phase detector, wherein the DC phase difference signal is converted into a DC phase error signal, as shown at 312. The method 300 may further include varying the impedance of the RF matching network with a controller in response to the DC magnitude and phase error signals, as shown at 314.

The foregoing has outlined features of several embodiments so that those skilled in the art may better understand the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

I claim:

1. A match system, comprising:

a rod configured to sense an AC process signal;

a first converter coupled to the rod and configured to receive a first AC voltage signal from the rod and to output a DC voltage magnitude signal;

a second converter coupled to the rod and configured to receive a first AC current signal from the rod and to output a DC current magnitude signal;

a multiplier coupled to the first and second converters and configured to receive the DC voltage and current magnitude signals and to output a DC magnitude error signal;

a phase detector coupled to the rod and configured to receive a second AC voltage signal and a second AC current signal from the rod and to output a DC phase difference signal, wherein the DC phase difference signal is converted into a DC phase error signal;

a RF matching network configured to receive the AC process signal; and a controller coupled to the multiplier, the phase detector, and the RF matching network and configured to receive the DC magnitude and phase error signals and to vary an impedance of the RF matching network in response to the DC magnitude and phase error signals.

2. The match system of claim 1, further comprising:

a capacitor coupled to the rod and configured to pick up an initial AC voltage signal from the rod, wherein the initial AC voltage signal is converted into at least one of the first and second AC voltage signals; and an inductor coupled to the rod and configured to pick up an initial AC current signal from the rod, wherein the initial AC current signal is converted into at least one of the first and second AC current signals.

3. The match system of claim 2, further comprising:

a first power splitter coupled to the capacitor and configured to split the initial AC voltage signal into the first and second AC voltage signals; and a second power splitter coupled to the inductor and configured to split the initial AC current signal into the first and second AC current signals.

4. The match system of claim 3, further comprising:

a first scaler coupled in series to the capacitor and configured to receive the initial AC voltage signal from the capacitor;

a first low pass filter coupled in series to the first scaler and the first power splitter and configured to receive the initial AC voltage signal from the first scaler and to transmit the initial AC voltage signal to the first power splitter;

a second scaler coupled in series to the inductor and configured to receive the initial AC current signal from the inductor; and a second low pass filter coupled in series to the second scaler and the second power splitter and configured to receive the initial AC current signal from the second scaler and to transmit the initial AC current signal to the second power splitter.

5. The match system of claim 3, further comprising:

a first scaler coupled in series to the first power splitter and configured to receive the first AC voltage signal from the first power splitter;

a first clamp coupled in series to the first scaler and the first converter and configured to receive the first AC voltage signal from the first scaler and to transmit the first AC voltage signal to the first converter;

a second scaler coupled in series to the second power splitter and configured to receive the second AC current signal from the second power splitter; and a second clamp coupled in series to the second scaler and the second converter and configured to receive the second AC current signal from the second scaler and to transmit the second AC current signal to the second converter.

6. The match system of claim 3, further comprising:

a first attenuator coupled in series to the first power splitter and configured to receive the second AC voltage signal from the first power splitter;

a first clamp coupled in series to the first attenuator and configured to receive the second AC voltage signal from the first attenuator;

a first band pass filter coupled in series to the first clamp and the phase detector and configured to receive the second AC voltage signal from the first clamp and to transmit the second AC voltage signal to the phase detector;

a second attenuator coupled in series to the second power splitter and configured to receive the second AC current signal from the second power splitter;

a second clamp coupled in series to the second attenuator and configured to receive the second AC current signal from the second attenuator; and a second band pass filter coupled in series to the second clamp and the phase detector and configured to receive the second AC current signal from the second clamp and to transmit the second AC current signal to the phase detector.

7. The match system of claim 1, further comprising:

a buffer coupled in series to the phase detector and configured to receive DC phase difference signal; and a scaler coupled in series to the buffer and configured to receive the DC phase difference signal from the buffer and to output the DC phase error signal.

8. The match system of claim 1, wherein at least one of the first converter, the second converter, the multiplier, and the phase detector comprises a telecommunications integrated circuit having wide bandwidth capabilities.

9. The match system of claim 8, wherein the telecommunications integrated circuit is configured to operate between 400 kHz and 3 GHz.

10. The match system of claim 1, wherein the match system is coupled to a plasma processing chamber and the controller is configured to vary the impedance of the RF matching network to reduce reflected power from the plasma processing chamber.

11. The match system of claim 10, wherein the RF matching network comprises at least one variable capacitor, and wherein the controller adjusts the at least one variable capacitor to vary the impedance of the RF matching network.

12. A method for varying an impedance of an RF matching network in a match system, comprising:

sensing an AC process signal generated by an RF generator with a rod coupled to the RF generator;

converting a first AC voltage signal from the rod to a DC voltage magnitude signal with a first converter;

converting a first AC current signal from the rod to a DC current magnitude signal with a second converter;

converting the DC voltage and current magnitude signals to a DC magnitude error signal with a multiplier coupled to the first and second converters;

converting second AC voltage and current signals from the rod to a DC phase difference signal with a phase detector, wherein the DC phase difference signal is converted into a DC phase error signal; and varying the impedance of the RF matching network with a controller in response to the DC magnitude and phase error signals.

13. The method of claim 12, further comprising scaling and buffering the DC phase difference signal to produce the DC phase error signal.

14. The method of claim 12, wherein varying the impedance of the RF matching network further comprises adjusting at least one variable capacitor in the RF matching network.

15. The method of claim 14, further comprising adjusting the at least one variable capacitor with at least one stepper motor.

16. The method of claim 12, wherein varying the impedance of the RF matching network further comprises varying the impedance of the RF matching network to reduce reflected power from a plasma processing chamber coupled to the match system.

17. The method of claim 12, wherein at least one of the first converter, the second converter, the multiplier, and the phase detector comprises a telecommunications integrated circuit having wide bandwidth capabilities.

18. A detector circuit, comprising:

a rod configured to sense an AC process signal transmitted from an RF generator to a plasma processing chamber;

a first converter coupled to the rod and configured to receive a first AC voltage signal from the rod and to output a DC voltage magnitude signal;

a second converter coupled to the rod and configured to receive a first AC current signal from the rod and to output a DC current magnitude signal;

a multiplier coupled to an output of the first and second converters and configured to receive the DC voltage and current magnitude signals and to output a DC magnitude error signal; and a phase detector coupled to the rod and configured to receive a second AC voltage signal and a second AC current signal from the rod and to output a DC phase difference signal, wherein the DC phase difference signal is converted into a DC phase error signal, and the DC magnitude error signal and the DC phase error signal are processed such that a power transfer from the RF generator to the plasma processing chamber is maximized.

19. The detector circuit of claim 18, wherein the DC magnitude error signal and the DC phase error signal are input to an RF match system and are processed such that an impedance of the RF match system is varied to maximize the power transfer.

20. The detector circuit of claim 18, further comprising:

a capacitor coupled to the rod and configured to pick up an initial AC voltage signal from the rod;

a first power splitter coupled to the capacitor and configured to split the initial AC voltage signal into the first and second AC voltage signals;

an inductor coupled to the rod and configured to pick up an initial AC current signal from the rod; and a second power splitter coupled to the inductor and configured to split the initial AC current signal into the first and second AC current signals.

* * * * *